United States Patent [19]

Hayashi

[11] Patent Number: 6,106,890
[45] Date of Patent: Aug. 22, 2000

[54] METHOD FOR FORMING A THIN FILM OF ULTRA-FINE PARTICLES AND AN APPARATUS FOR THE SAME

[75] Inventor: Chikara Hayashi, Chigasaki, Japan

[73] Assignee: Vacuum Metallurgical Co., Ltd., Japan

[21] Appl. No.: 08/771,872

[22] Filed: Dec. 23, 1996

[30] Foreign Application Priority Data

Dec. 27, 1995 [JP] Japan ........................................ 3-52655

[51] Int. Cl.$^7$ .................................................. C23C 14/22
[52] U.S. Cl. ............................. 427/97; 427/99; 427/181; 427/190; 427/191; 427/201; 427/226; 427/229; 427/237; 427/248.1; 427/249.1; 427/255.25; 427/255.7
[58] Field of Search ................................ 427/97, 99, 181, 427/190, 191, 201, 226, 229, 237, 248.1, 249, 255.2, 255.3, 255.7, 249.1, 255.25

[56] References Cited

U.S. PATENT DOCUMENTS

| | | | |
|---|---|---|---|
| 3,840,391 | 10/1974 | Spitz et al. | 427/250 |
| 4,332,838 | 6/1982 | Wegrzyn | 427/74 |
| 4,405,658 | 9/1983 | Young | 427/63 |
| 5,456,945 | 10/1995 | McMillan et al. | 427/248.1 |
| 5,540,959 | 7/1996 | Wang | 427/248.1 |

*Primary Examiner*—Timothy Meeks
*Attorney, Agent, or Firm*—Piper Marbury Rudnick & Wolfe

[57] ABSTRACT

A method and apparatus for forming a thin film of ultra-fine particles on a base body having a fine hole or groove with a large aspect ratio (larger than one). The ultra-fine particles are smaller than 0.1 μm in diameter and are made from evaporated material. An aerosol is formed by dispersing and floating the ultra-fine particles in a gas at a pressure higher than $10^2$ Pa in an aerosol-forming chamber. The base body is held by a holding mechanism within a thin-film forming container. A vacuum system is connected to the thin-film forming container. The aerosol-forming chamber is placed in communication with the thin-film forming container so that the aerosol is applied onto the inner wall surface of the fine hole or the groove. As a result, the ultra-fine particles are diffused and adsorbed onto the inner wall surface.

10 Claims, 8 Drawing Sheets

METHOD FOR FORMING A THIN FILM OF ULTRA-FINE PARTICLES AND AN APPARATUS FOR THE SAME

BACKGROUND OF THE INVENTION

1. Field of the Invention

This invention relates to a method for forming a thin film of ultra-fine particles, and an apparatus for the same, and more particularly to a method for forming a thin film of ultra-fine particles and an apparatus for the same by which a thin film of ultra-fine particles is formed on an inner wall surface of a hole smaller than 12 μm in diameter, and having an aspect ratio of larger than one.

2. Description of the Prior Art

Among methods for forming a thin film, there are a sputtering method, a deposition method, a physical vapor deposition method (PVD) such as an ion-beam deposition method, a chemical deposition method (CVD), a plating method and any other liquid phase film-forming method. In the physical vapor deposition method, atoms or molecules as film-forming material move in a straight line, from the generating source. Accordingly, positions on the base body on which a thin film should be formed, depend on the geometrical arrangement or mechanical arrangement of the generating source of the film forming material and of the base body. It is almost impossible to form a uniform film on an inner wall surface of a fine hole of large aspect ratio or a groove of the similar size, in the base body, since the straight flight line of the film forming material does not reach there. On the other hand, it is possible to form a relatively uniform film on the above fine hole or groove, by the CVD method or liquid phase film forming method. However, it is unavoidable that any impurities are mixed into the formed thin film.

Among methods for forming thin films of ultra-fine particles, there are a so-called "Gas Deposition method" or "Jet Printing method" in which a transport pipe and jet gas for transport are used to form locally a thin film, and "Cluster ion beam method" in which ionized grain beams are used. However, also in these methods, the film forming condition is limited by the geometrical or mechanical arrangement of the generating source of the film forming material and of the base body. Further, there is the method in which ultra-fine particles are sinked or precipitated from the liquid phase. However, in this method, a surface tension acts between the. inner wall surface of the hole or grove, and so it is difficult to form uniformly a thin film. Accordingly, this method cannot be widely used.

As above described, it is difficult to form a uniform thin film without impurity, on the inner wall surface of the fine hole or groove, by the above Prior Art thin film forming methods. Accordingly, in one case a high-integrated semi-conductor device, in which via holes are made having an aspect ratio of larger than one, and a line width equal to a fraction of a μm or smaller is subject to various limitations of manufacture. In another case it is difficult to form a uniform film of activated metal on the inner wall surface of fine holes on a catalyst carrier of high performance.

Figure 1:
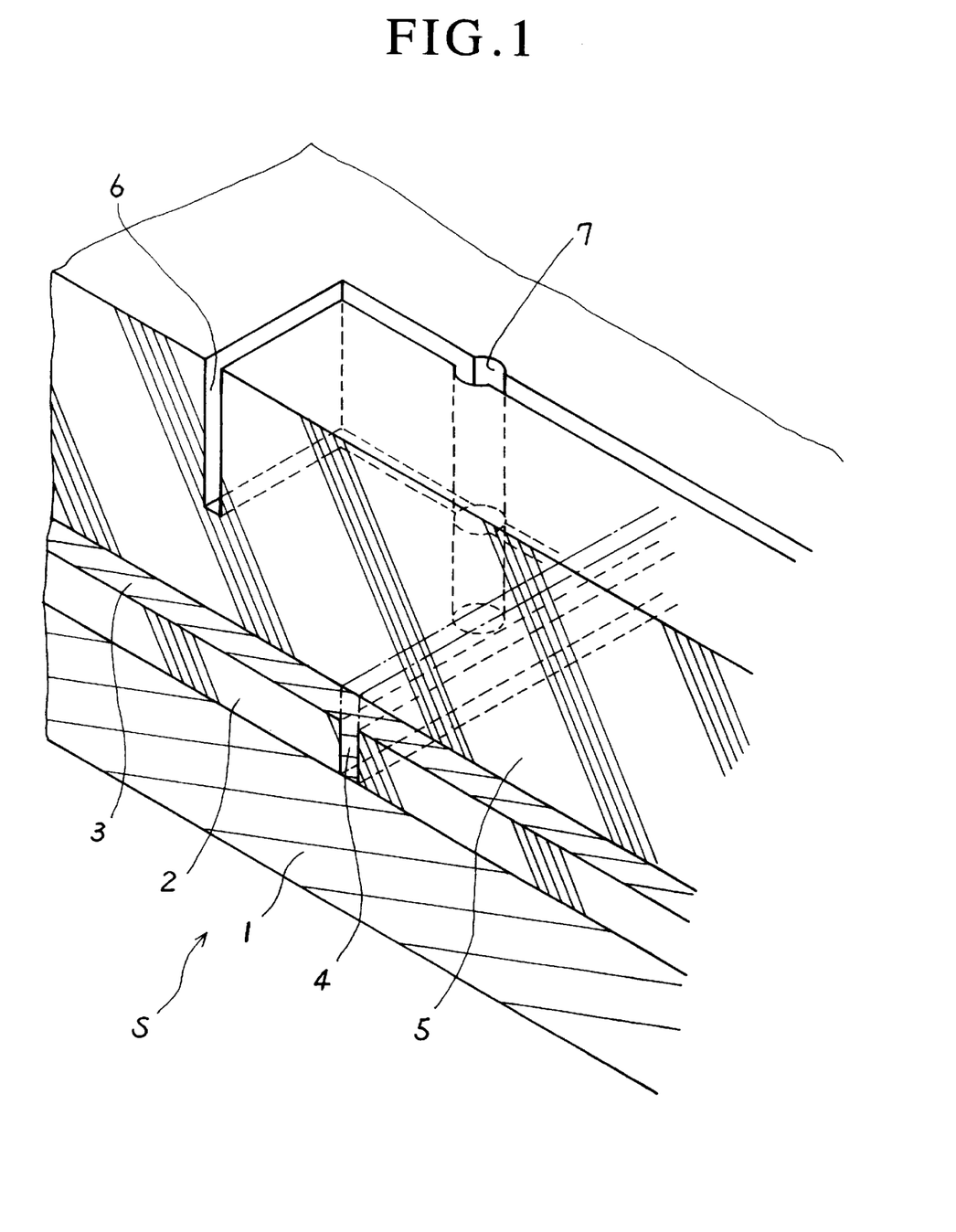
FIG. 1. is an enlarged perspective view of a part of a base body having fine holes and groove, as one example which is applied to the embodiment of this invention.
Figure 2:
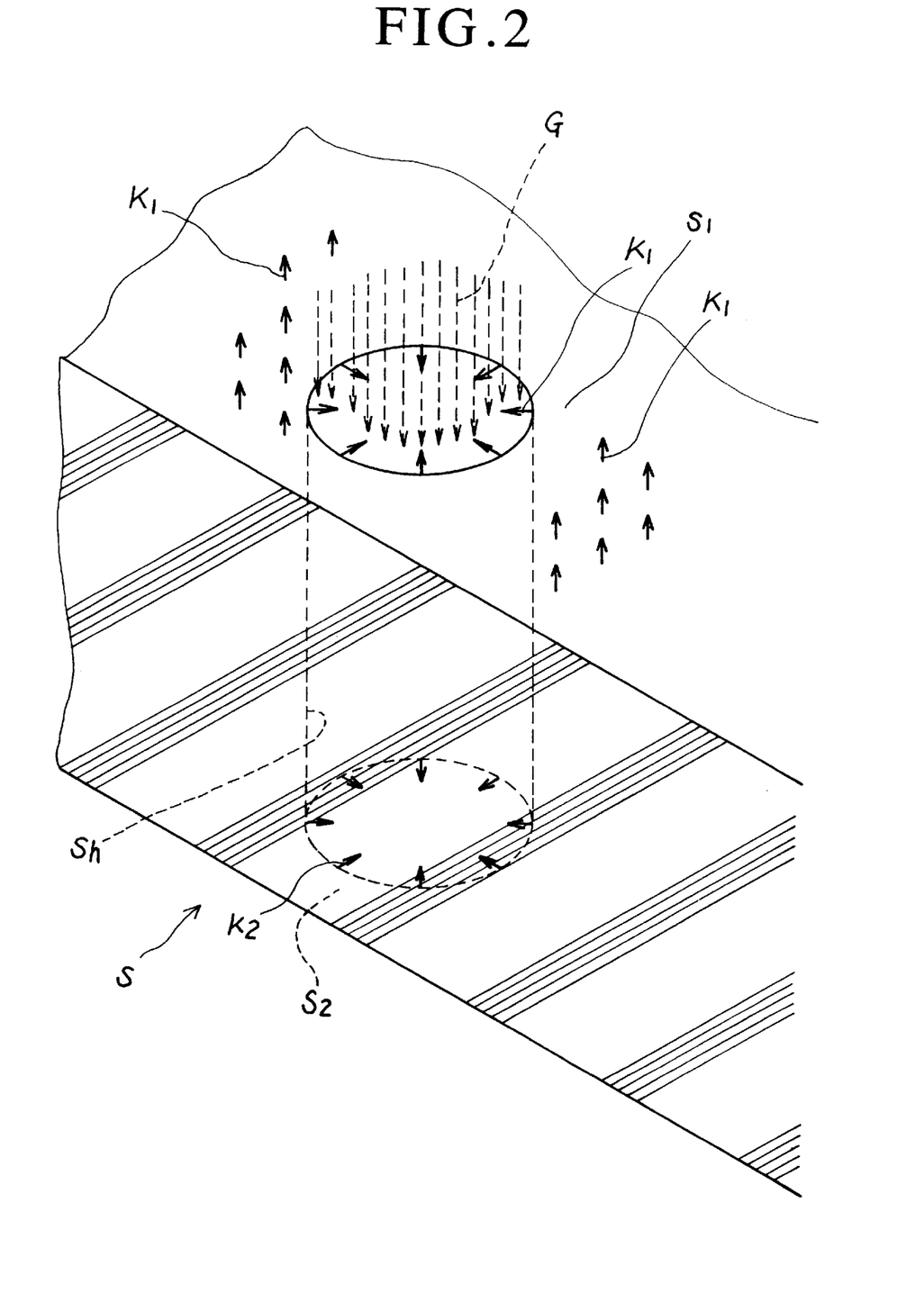
FIG. 2 is an enlarged perspective view of a part of the base body by which directions of thermal migration forces due to the thermal gradient are shown on the base body.
Figure 3A:
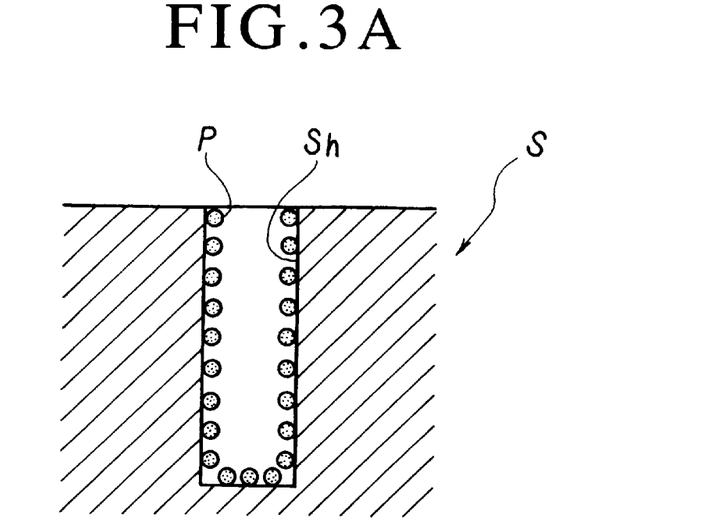
Figure 3B:
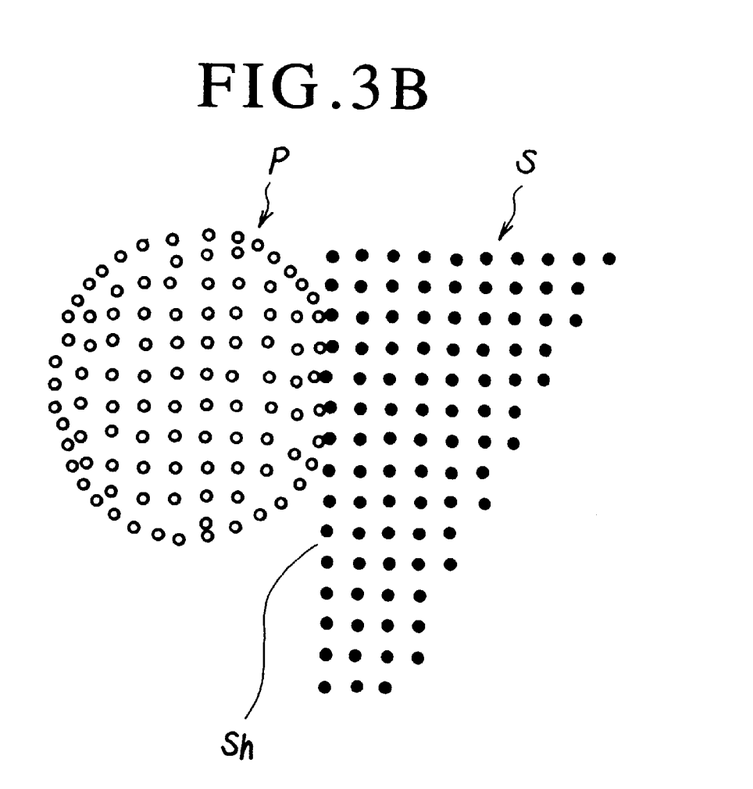
Figure 4A:
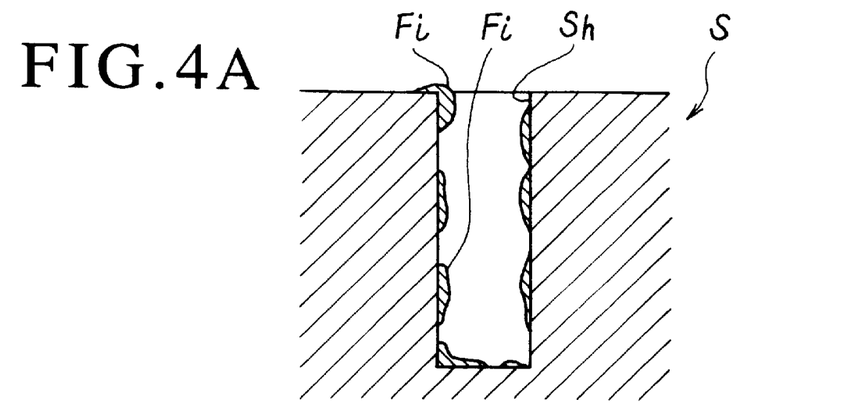
Figure 4B:
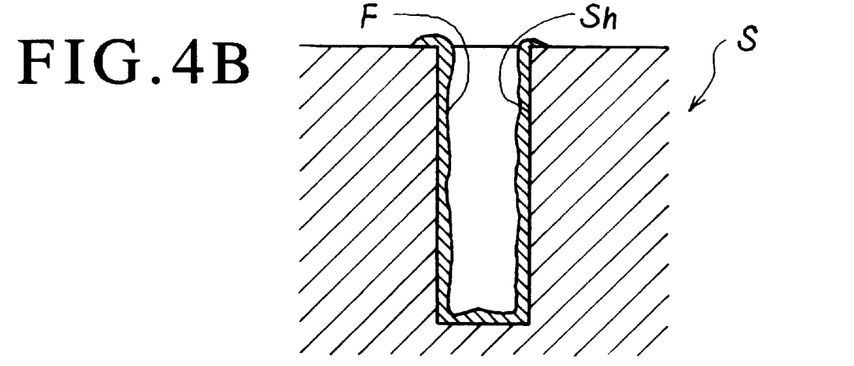
Figure 4C:
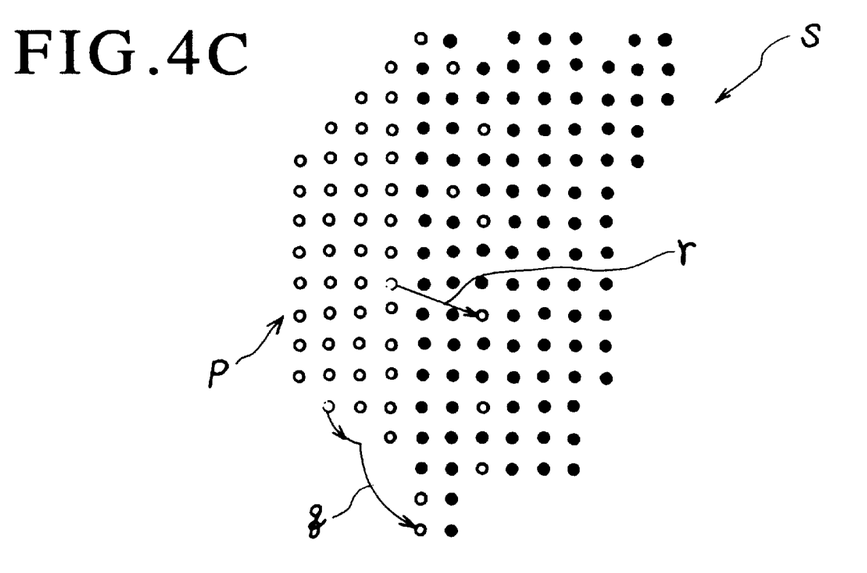

As an example, a base body S in which fine holes or grooves are made, is schematically shown in FIG. 1. A film 2 of silicon oxidate as insulator is formed on a silicon substrate 1. Another film 3 of aluminium is formed on the film 2. A fine groove 4 is formed in the film 2, and it is filled with aluminium. A second silicon oxidate film 5 is formed on the aluminium film 3. A second groove 6 is made in the film 5, and its bottom is the upper surface of the film 3. A via hole 7 with the bottom which is the upper surface of the film 3, is made in the groove 6. The groove 6 is 0.1 μm in width, and 0.3 μm in depth. The via hole 7 is 0.2 μm in diameter, and 1 μm in depth. The aspect ratio of the groove 6 is equal to 3, and that of the via hole 7 is equal to 5. It is difficult to form a thin film of metal, or particularly, high-melting metal or ceramics, onto the inner wall surfaces of the groove 6 and via hole 7, by the Prior Art PVD method

SUMMARY OF THE INVENTION

Accordingly, it is an object of this invention to provide a method of forming a thin film and an apparatus for the same in which a uniform thin film can be formed on an inner wall surface of a fine hole with a diameter of 2 μm or smaller in diameter, and having aspect ratio of larger than one, or a groove of similar size, regardless of any geometrical or mechanical arrangement of a generating source of film forming material, and of a base body to be film-formed, and in which impurity is not mixed into the thin film in contrast to the Prior Art CVD method and liquid phase film forming method.

In accordance with an aspect of this invention,

A method of forming a thin film of ultra-fine particles on a base body for a semiconductor device, comprising the steps of: arranging said base body under vacuum, said base body having a hole with a bottom, or a through hole, formed therein with a diameter smaller than 2 μm and an aspect ratio larger than one, or a groove formed therein with a width smaller than 2 μm and a ratio of depth/width larger than one; applying an aerosol within which ultra-fine particles are dispersed and floating in gas under a pressure higher than $10^2$ Pa, said ultra-fine particles being smaller than 0.1 μm in diameter and made from evaporated material for forming said thin film; and diffusing and adsorbing said ultra-fine particles onto said inner wall surface.

In accordance with another aspect of this invention,

An apparatus for forming a thin film of ultra-fine particles comprising: an aerosol generating apparatus in which ultra-fine particles of smaller than 0.1 μm in diameter are made from evaporabed material, and are dispersed and floating in gas; a holding mechanism for holding a base body having a hole with bottom, a through hole, smaller than 2 μm in diameter and having aspect ratio of larger than one or a groove having the similar size, a thinfilm of ultra-fine particles being formed on said base body; a heating mechanism for heating said base body; a pressure-adjusting mechanism for maintaining said aerosol at a predetermined pressure; a thin-film forming container containing at least said holding mechanism; and a vacuum system connected to said thin-film forming container;

The foregoing and other objects, features, and advantages of the present invention will be more readily understood upon consideration of the following detailed description of the preferred embodiment of the invention, taken in conjunction with the accompanying drawings

BRIEF DESCRIPTION OF THE DRAWINGS

FIG. 3 is a schematic cross sectional view for explaining film forming of ultra-fine particles, A shows adsorption of ultra-fine particles at the initial stage of the film forming and B shows micro-scopic view of one adsorbed ultra-fine particle in the level of atom or molecule FIG. 4 is a schematic cross-sectional view for explaining film forming of ultra-fine particles, A shows a growing island-like film, B shows further growing film, more densed, and C shows microscopic view of one adsorbed ultra-fine particle, part of which is chemically diffused in the inner wall surface, on the atomic or molecular level.

FIG. 7 is a schematic side view showing a base body-holding mechanism for holding plural base bodies, A shows a stationary type and B shows a rotary type.

FIG. 8 is schematic plan views showing a series of plural film forming containers, A an inline-type, B a rotary type, C a cluster type.

DESCRIPTION OF THE PREFERRED EMBODIMENTS

First, the novel fluid mechanics of this invention, by which a thin film can be formed on an inner wall surface of a fine hole having a large aspect ratio, by isotropic diffusion and adsorption will be described.

(1) Producing or forming aerosol in which ultra-fine particles are dispersed and floating in gas. For example, it can be produced in such a manner that film-forming material as solid ultra-fine particles are evaporated into gas as a dispersion medium.

(2) A base body having a fine hole or groove is cleaned and, as occasion demands, its surface is activated. Then, the base body is held in a film-forming container. For example, the base body is made of ceramics, and may be a three-dimensional body.

(3) The film-forming container is evacuated, so that the fine hole and groove of the base body held in the film-forming container are evacuated.

(4) Aerosol in which ultra-fine particles are dispersed and floating in gas, is introduced into the film-forming container, to contact with the base body and invade into the fine hole and groove.

(5) After a suitable time, an additional operation, for example exposure to a hot gas, is applied to the base body and then the base body on which the thin film of ultra-fine particles has been formed, is taken out from the film forming container.

The thin film is basically formed on the base body in the above manner. The ultra-fine particles are isotropically diffused and the process of this invention is quasi-static. Accordingly, the principle of this invention is basically different from that of the gas deposition method utilizing the dynamic energy of the carrying gas. This film-forming method is mechanically and macro-scopically similar to the oil-invading method to a cable or the like. However, a film of a high melting metal or ceramic cannot be formed on the cable and oil cannot be invaded into the cable.

(6) Additional operations are effected as follows:
① Thermal Treatment
Rising the temperature of the base body to activate ultra-fine particles to be adsorbed on the inner wall surface.
(a) Surface Diffusion. This is a physical stabilization treatment. Typical temperature is 50 to 300° C.
Or (b) Adsorbing chemically ultra-fine particles onto the base This is a chemical reacting treatment and a typical temperature is 200 to 800° C.

② Surface Modification
As occasion demands, after the thin-film forming container is evacuated, a reaction gas is introduced into the container to chemically react with the surfaces of the ultra-fine particles and to clean and modify surfaces of them. The typical gas reaction is hydrogenation, oxidation, nitrogenation, halogenation, or carbon adittion.
③ Multi-layer Film Forming
Both in the heat treatment and in the surface modification treatment, film forming operations of different kinds of ultra-fine particles are repeated.
④ Surface Protection
Protecting gas or liquid is introduced into the container, for example, to protect the surfaces of ultra-fine particles and of the inner wall surfaces on increasing the temperature.

Since heavy gas is not easily exited from the hole smaller than 0.1 $\mu$m in diameter, the protection for a short time can be possible.

In the principle of this invention, the thin film can be formed on the inner wall surface by diffusion and adsorption due to the isotropic fluid mechanics. The requirements for the fluid mechanics will now be described.

(1) In the thin film forming container of the usual size (for example, larger than 10 cm in diameter), the pressure of helium (He) should be higher than, for example, 260 Pa. or that of Argon (Ar) should be higher than, for example, 130 Pa so that the ultra-fine particles of 5 nm in grain size can float in the gas regardless of the gravity. The floating of the ultra-fine particles can be obtained by the scattering movement due to the collisions of the molecules or atoms of the gas, and the above pressure is inversely proportional to the mean free path of the used gas. When the ultra-fine particles of 0.1 $\mu$m in diameter are stably floated, the pressure of the used gas should be higher than $10^2$ Pa.

(2) The aerosol in which ultra-fine particles are dispersed and floating, is invaded into the deep hole of 0.2 $\mu$m in diameter (for example, aspect ratio of 5, and 1 $\mu$m in depth), and the ultra-fine particles are uniformly distributed on the inner wall surface of the hole and adsorbed thereon. This requires the following:

(I) The ultra-fine particles do not coagulate by their collision in the aerosol.

(II) The adsorption or adhering of the ultra-fine particles due to their collision with the inner wall surface is not localized near the entrance of the hole.

To fulfill the above requirement (I), the mean time required for the first collision of the ultra-fine particles to the second collision of them should be longer than a mean time required for the collision of the ultra-fine particles with the inner wall surface of the hole. the following formula (1) is required:

$$np \cdot c \cdot \sigma^2 << a \quad (1)$$

where $\sigma$ represents mean grain size of ultra-fine particles
np represents grain density of ultra-fine particles
c represents volume of hole
a represents surface area of inner wall of the hole To fulfill the above requirement (II), the following formula (2) is required:

$$\lambda/r < 1/5 \quad (2)$$

$$r/l > <V_p> \cdot (\lambda/\lambda p \cdot u) \quad (3)$$

$$np \cdot c > a - \beta \quad (4)$$

$$np << ng \quad (5)$$

$$(<V_p>/<V_g>) = (mg/mp)^{1/2} \quad (6)$$

where λ represents mean free path for the collision of the ultra-fine particles and gas molecule or atom, λp represents mean free path for the collision of the ultra-fine particles each other r represents diameter of the hole l represents depth of the hole and B represents number of the adsorbed particles to unit area of the inner wall surface of the hole ng represents density of molecules or atoms of the gas u represents speed of the invading of the aerosol of ultra-fine particles dispersed and floating Vp represents thermal motion speed of the ultra-fine particles Vg represents thermal motion speed of the gas atoms or molecules mp represents mass of ultra-fine particles mg represents mass of gas atoms or molecules In the formula (2), the aspect ratio of 5 is assumed.

The formula (3) represents that the number of the total ultra-fine particles existing in the hole is larger than the number of the ultra-fine particles adsorbed on the inner wall surface of the hole in the time when the aerosol from the entrance of the hole reaches the bottom of the hole.

Among the above described factors, r, l, (therefore a and c), <Vp>,<Vg> are predetermined. The selectable factors are σ, np, ng, u and β. λ and λp depend on np, ng, α and the kind of the used gas.

In the requirements (I) and (II), there are five variables and five inequalites.

Actually, α and β are last determined. However, it is clear that the grain size σ of the ultra-fine particles is smaller than 0.1 μm and further smaller than the diameter r of the hole. For example, the grain diameter σ≦0.01 μm for the hole diameter r=0.2 μm is required.

When the hole diameter r is equal to 0.2 μm and the aspect ratio is equal to 5, and λ is smaller than 0.04 μm. When λ is equal to 0.04, the gas pressure is equal to 5 atm for Helium and to 1.5 atm for Argon. 1 atm is equal to $10^5$ Pa (atmosphere pressure). When the hole diameter r is equal to 0.1 μm, the gas pressure is equal to 10 atm for Herium and to 3 atm for Argon, if the same relationship is assumed as in the above case. The smaller the hole diameter, the gas pressure the higher.

When the thin film formed on the inner wall surface of the hole consists of more than one layer of atoms or molecules, β×[the number of atoms or molecules constituting single ultra-fine particle] should be larger than the number of atoms or molecules per unit area in the single layer of atoms or molecules. However, β is within the range limited by the above requirements (I) and (II). Accordingly, the value β cannot be always satisfactorily selected. In such a case, the film forming operations should be repeated the required times. Further, when multilayers of ultra-fine particles of the same or different kinds are formed, the film forming operations are repeated.

When there is no hindrance in the geometrical or mechanical arrangement of the generating source of film forming material and of the base body, a uniform film can be formed on the inner wall surface of the hole which is large in diameter and the aspect ratio of which is about 5, also by the prior art PVD method. Accordingly , either the prior art PVD method or the method of this invention can be selected in consideration of economy. However, when the hole diameter is smaller than about 2 μm, it is difficult to form uniformly a thin film by the prior art PVD method. In other words, that the hole diameter is smaller than 2 μm, is a requisite condition for this invention. Also when the hole diameter is larger than 2 μm, this invention can be applied. However, when the hole diameter is larger than 2 μm, it is profitable to use the prior art method. (3) When the ultra fine particles are floated, the film thickness can be controlled by the thermal migration method. This is one principle of this invention.

For example, the case will be discussed that the base body is so large as to have the thermal gradient higher than 1° C. The dispersed and floating ultra-fine particles are subject to the effect of the thermal motion of the gas atoms or molecules. The ultra-fine particles are moved from the high temperature side to the low temperature side. With reference to FIG. 2, the temperature of the upper surface S1 of the base body S having the hole Sh is T1, that of the lower surface S2 of the base body S having the hole Sh is T2, that of the gas G as disperse medium is Tg, the thermal migration force is K1 on the upper surface S1, and that is K2 on the lower surface S2. Under the above conditions, K1 is equal to α (T1−Tg) and K2 is equal to α (T2−Tg). The ratio R1/R2 of the film forming speed R1 of the upper surface S1, to that R2 of the lower surface S2 is proportional to (K2/K1). Accordingly, at the thermal gradient of T1>T2, KI>K2 and so R1<R2. The film forming speed R2 of the lower surface S2 is higher than that R1 of the upper surface S1. This effect is in the order of milli seconds. This is practical in the quasi-static gas phase. Thus the film forming speed on the inner wall surface of the fine hole can be controlled with the thermal gradient or distribution on the base body. As above described, the thermal migration effect can be utilized in order to obtain a uniform film or intentionally a predetermined thickness difference of formed films.

In the above film forming operation, it is inferred that the atoms or moleculues of the ultra-fine particles difuse and spread on the inner wall surfaces of the fine holes. This surface diffusion is not always effected. Accordingly, additional treatments such as heat-treatment and introductions of different gases, as location demands, are done to modify the surfaces. FIG. 3 and FIG. 4 explain the film forming process and the effect of the heat treatment schematically. FIG. 3 A shows the physical adsorption of the ultra-fine particles P onto the inner wall surfaces of the fine hole Sh of the base body S at the initial stage. FIG. 3B shows microscopic view of atoms or molecules adsorbed on the inner wall surfaces. The inner wall surface is constituted by the black circles. One ultra-fine particle is constituted by the white circles. The black and white circles represent atoms or molecules.

Physically adsorbed ultra-fine particles P are heated, and so a part of the atoms or molecules constituting the ultra-fine particules P are scattered out and diffused onto the inner wall surface. They are captured by the atoms or molecules constituting the base body S to form nucleus. Such film forming operation is continued, and island-like films Fi are formed on the inner wall surface of the hole Sh, as shown in FIG. 4A.

Sequently, a close or uniform film F is formed. When the temperature is higher, a part of the atoms or molecules constituting the ultra-fine particles are diffused into the base body S and chemically adsorbed on the inner wall surface. FIG. 4C corresponds to FIG. 3B, although the former is more microscopic than the latter. One part g of the atoms or molecules constituting the ultra-fine particle P are diffused onto the inner wall surface of the fine hole, while another part r there of are diffused into the base body S. As occasion demands, halogenation. oxidation, nitriding, halogenation or carbon addition for surface modification is added to the above heat treatment for the base body S. Or the above heat treatment and the above gas introduction may be employed for clarifying the surface prior to the film forming, the surface stabilization after the film forming, or activating.

Next, a thin film forming method for an ultra-fine particle and its apparatus for the same, will be described with reference to the drawings.

Figure 5:
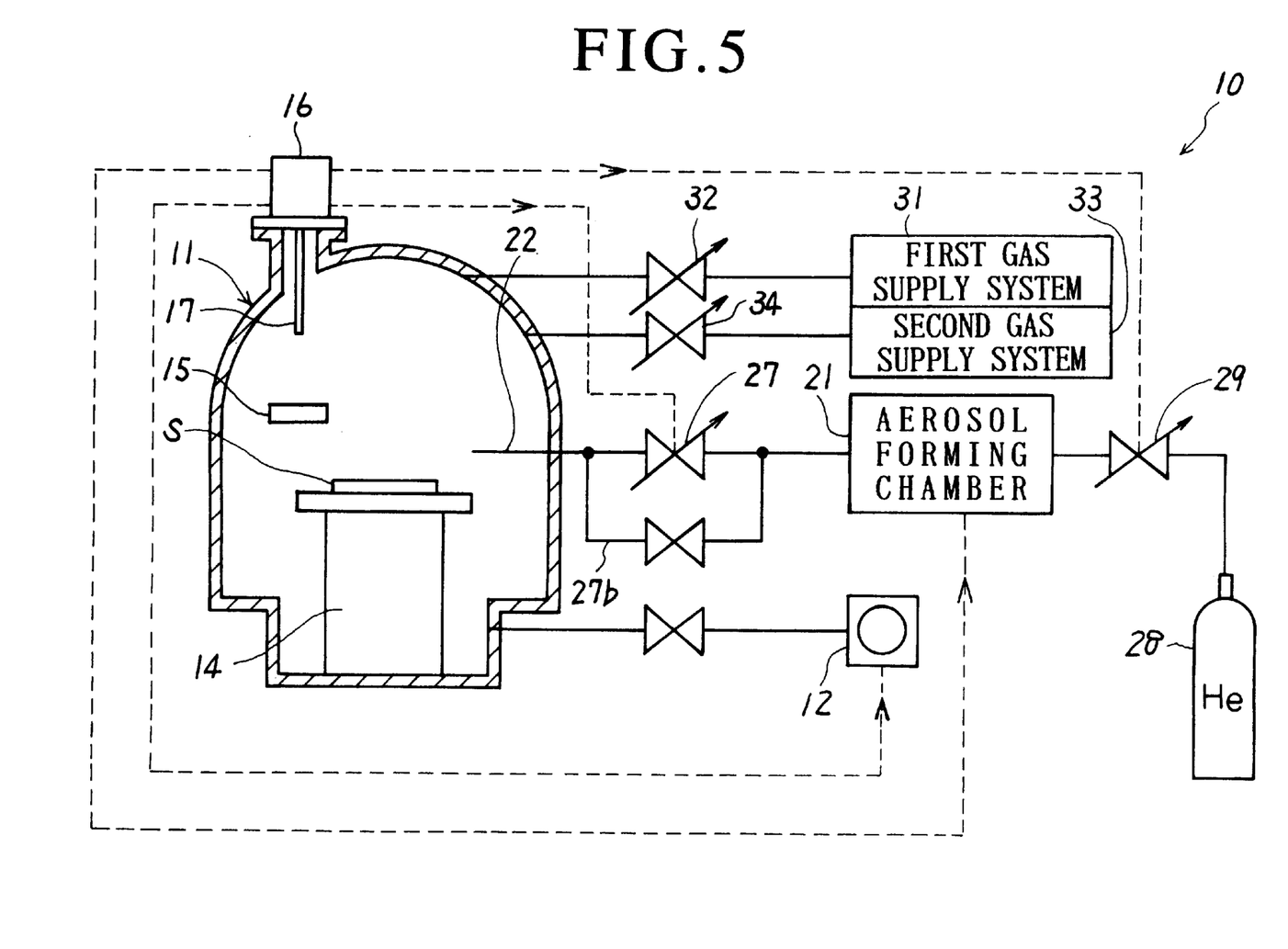
FIG. 5 is a schematic view of a film forming apparatus.

FIG. 5 is a schematic cross sectional view of a film formimg apparatus 10. It is of a pressure tight construction. Its film forming container 11 is connected at the bottom to a vacuum system 12. A transport pipe 22 is inserted into the film forming container 11. An aerosol which ultra-fine particles are dispersed and floating in gas, is transported through the transport pipe 22 from an aerosol forming chamber 21. A control valve 27 for controlling the supply of the aerosol is arranged in the transport pipe 22 with a by-pass conduit 27b with a valve. Further, a bottle 28 of the helium gas, as disperse medium is connected through a control valve 29 to the aerosol forming chamber 21. The control valve 29 controls predetermined pressures of the aerosol forming chamber 21 and film forming container 11.

A first gas supply system 31 and a second gas supply system 33 are connected through control valves 32, 34 to the film forming container 11. A gas as occasion demands, is introduced for cleaning the base body S prior to film forming, or the surface modification and for the surface protection before the heat treatment prior to the film forming for the stability and activation of the surface. In the embodiment of this invention, the first gas supply system 31 includes an ozone gas or oxygen radical generating apparatus for cleaning the base body S and the second gas supply system 33 includes an argon gas supply system for the stability processing after the film forming and the surface protection.

The film forming container 11 contains a base body holding frame 14 for holding the base body S as shown in FIG. 1. The base body S is introduced into the film forming container 11 through not shown gate. The base body holding frame 14 contains a heating mechanism for heating the base body S. And a film thickness monitor 15 as dummy is attached near the base body S. The thickness of the thin film formed is measured by a measuring control apparatus 16 which is fixed to a mounting flange arranged at the upper part of the film forming container 11. The film thickness is optically measured by an ultraviolet radiation. The measuring control apparatus 16 further controls opening and closing of the control valves 27, 29 on the bases of the measuring result. A probe 17 for measuring the film thickness is inserted into the film forming container 11 above the film thickness monitor 15. The film thickness is optically measured, but it may be measured electrically. The measuring control apparatus 16 controls further the stop and start of the vacuum system 12 and opening and closing of a shutter for crucible 23 arranged in the aerosol forming chamber 21, in FIG. 6.

Figure 6:
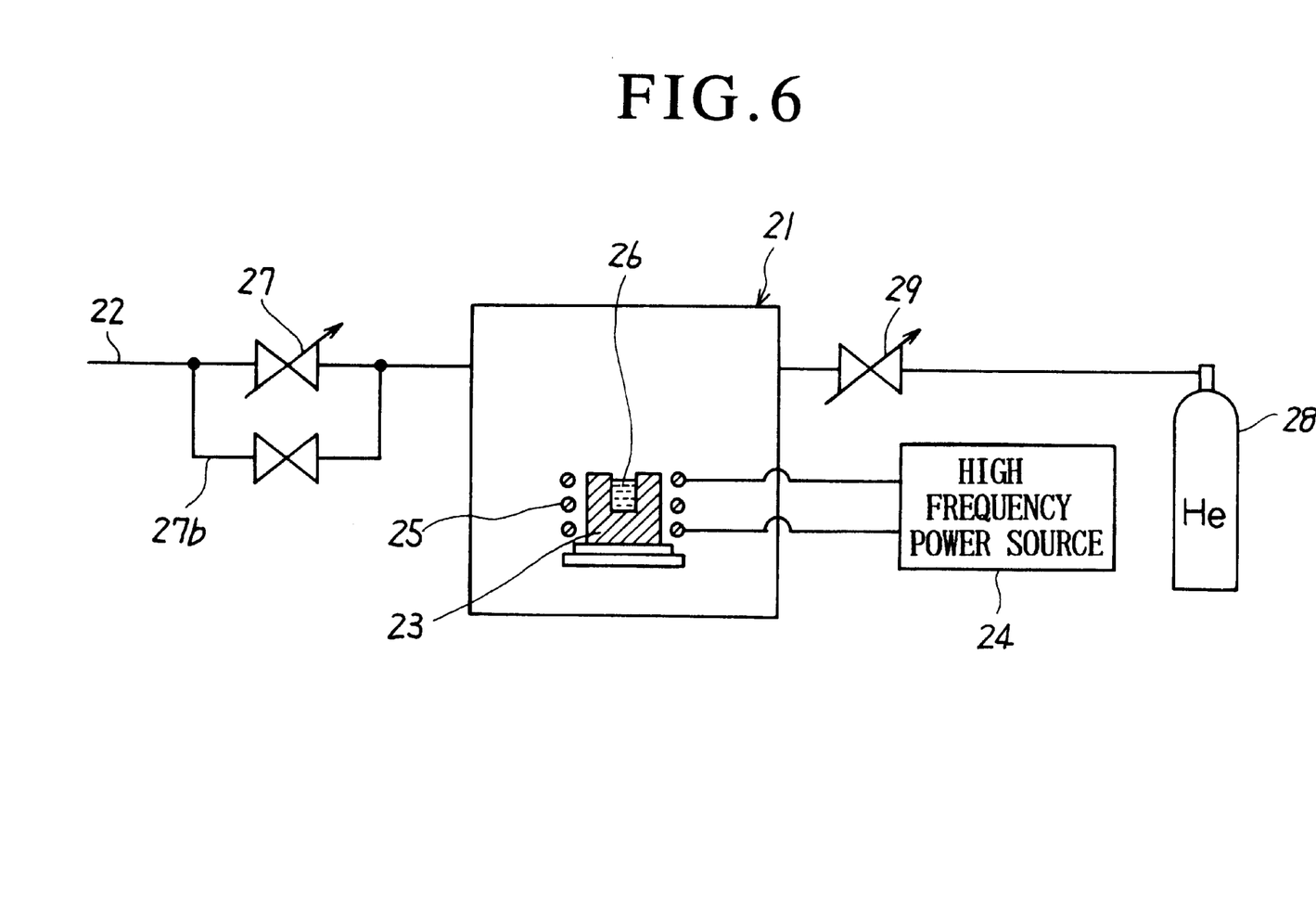
FIG. 6 is a schematic view of an aerosol-forming chamber.

FIG. 6 is a schematic cross sectional view of the above aerosol forming chamber 21. The crucible 23 is arranged in the aerosol forming chamber 21. A not-shown shutter is arranged above the crucible 23. A high frequency coil 25 is wound on the crucible 23 and the coil 25 is connected electrically to a high frequency power source 24. Aluminum 26 is contained in the crucible 23 and it is evaporated at the predetermined temperature. The helium gas bottle 28, the control valve 29 and the control valve 27 have been described as above.

The film forming apparatus 10 according to the embodiment of this invention is above constructed. Next, the film forming method will be described using the above film forming apparatus 10.

First, the base body S is held on the base body holding frame 14 in the film forming container 11. The base body holding frame 14 is heated at the 200° C. by the heating mechanism contained in the base body holding frame 14. The interior of the film forming container 11 is evacuated by the vacuum system 12. Sequently, the control valve 32 is opened for a predetermined time and ozone gas or the oxygen radical gas is introduced from the gas supply system 31. Accordingly, subtle amount of organics adhearing to the base body S are oxygenatedly removed. At the same time, the groove 6 and the through hole 7 are evacuated. Sequently, the control valve 27 is opened and the aerosol forming chamber 21 is evacuated and then the vacuum system 12 stops. And the control valve 27 is closed.

Next, the aerosol in which the ultra-fine particles are dispersing and floating in the helium gas, are produced in the aerosol forming chamber 21. The grain size of the ultra-fine particle almost depends on the temperature of aluminum evaporating, the kind of the using gas and gas pressure. And refening to FIG. 6, the control valve 29 is opened and helium gas is introduced from the bottle 28 so that the pressure of the aerosol forming chamber 21 is maintained. At the same time, the aluminum 26 in the crucible 23 is heated by the high frequency power source. The shutter for the crucible is opened and aluminum 26 is evaporated. The ultra-fine particles are dispersed and floated into the helium gas.

Subsequently, the control valve 27 is opened. The ultra-fine particles dispersed and floated in the helium gas are introduced into the film forming container 11. After the pre-determined amount of aluminum is evaporated, the shutter for the crucible 23 is closed. The opening of the control valve 29 is controlled, and the pressures of the film forming container 11 and the aerosol forming chamber 21 are risen and maintained at the pressure of 5 atm. In this time, the aerosol is invaded into the groove 6 and through hole 7 in the base body S. The ultra-fine particle of the aluminum are diffused to the heated groove 6 and through hole 7.

Next, the film thicknesses aluminum formed on the inner surface of the groove 6 and of the through hole 7 of the base body S, are in-directly measured by thickness monitor 15 on which the thin film is formed. The measuring control apparatus 16. measures optically and continuously the film thickness formed on the monitor 15. When the predetermined thickness of the film has been obtained, the control valves 27, 29 are closed.

When the film thickness to be formed, is larger or when the predetermined film thickness cannot be obtained by one aerosol operation, the above operation except the cleaning operation, are repeated. In the meantime, the measuring control apparatus 16 controls the opening and closing of valves 27, 29, the opening and closing of the shutter for the crucible 23 and the stop and start of the vacuum system 12.

When the aluminum film of the predetermined thickness has been formed, the vacuum system 12 starts to evacuate the interior of the film forming container 11. Then, the control valve 34 is opened to introduce argon gas and the holding frame 14 is heated by the included heating mechanism to heat the base body S at the temperature of 300° C. The base body S is heated for the predetermined time. The aluminum film is stress-relaxed and stabilized with this heating operation. Thus, a series of film-forming operations is completed. The base body S in which aluminum film is formed on the Inner surface of the groove 6 and the through hole 7, is taken out from the film forming container 11.

In the above embodiment, the aluminum ultra-fine particles of 5 nm in the mean diameter are used for forming film on the inner surface walls. The width of the groove 6 is equal to 0.1 μm and that of the through hole 7 is equal to 0.2 μm in diameter, and the groove 6 and the through hole 7 have aspect ratios 3 and 5, respectively. The films are formed on the inner walls of the above groove 6 and through hole 7. Further, when the aerosol is produced, the pressure 260 Pa is maintained and when the film is formed, its pressure is maintained at 5 atm. Thus, the pressures are two-step wisely changed. However, when the hole is 2 μm in diameter and has the aspect ratio of one, the pressure of $10^8$–$10^4$ Pa, can be used in common, in the aerosol producing operation and the film forming operation.

While the preferred embodiment has been described, variations there-to will occur to those skilled in the art within the scope of the present inventive concepts which are delineated by the following claims.

Figure 7A:
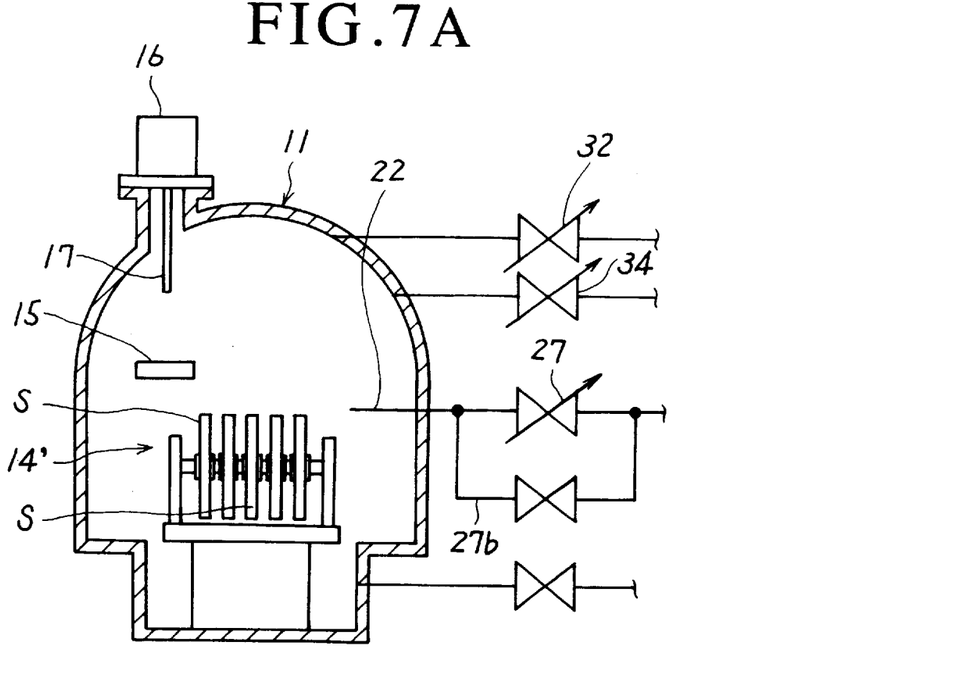
Figure 7B:
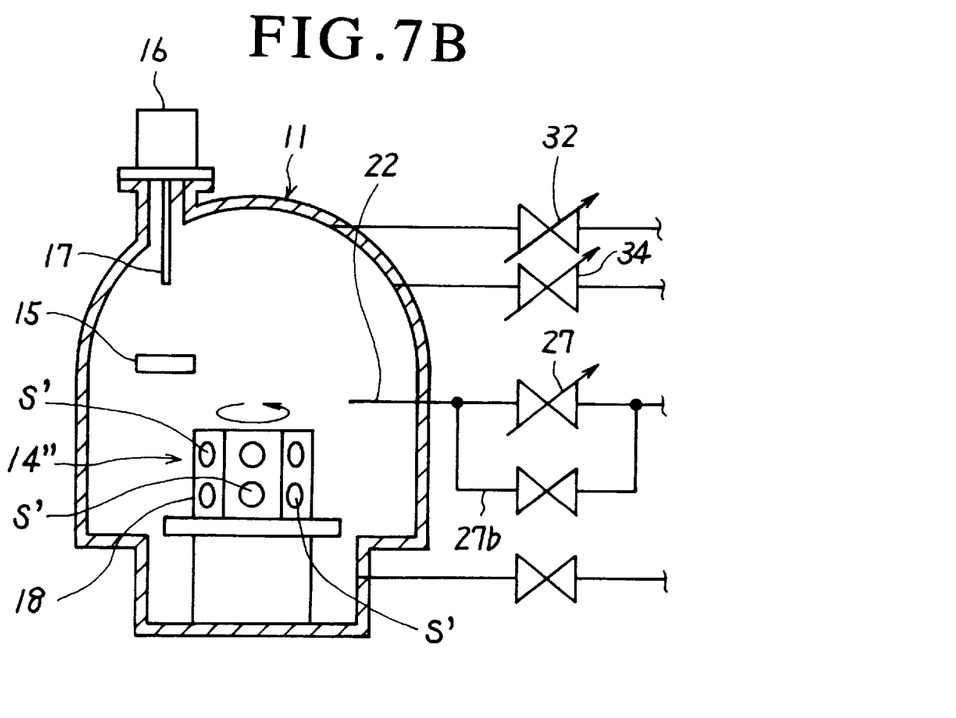

For example, in the above embodiment, the one base body S is held on the base body holding frame 14 in the film forming container 11. However, of course, a plurality of base bodies S, as shown in FIG. 7A, may be held on a base body holding frame 14' and thin films may be formed on the base bodies at the same time. Or as shown in FIG. 7B, a plurality of the base bodies S' may be arranged on the circumferential surfaces of the angular drum 18, in which the drum 18 is rotated around the axis.

Figure 8A:
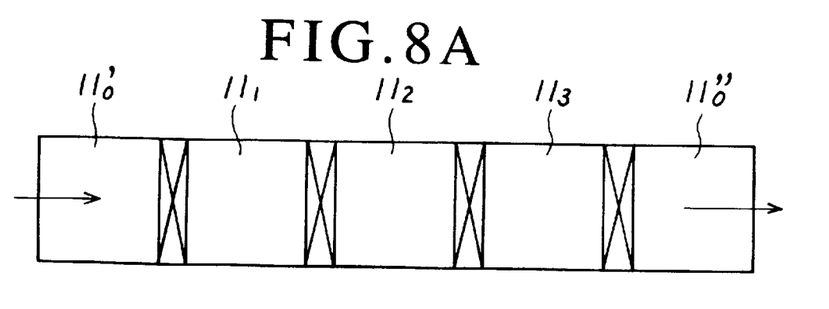
Figure 8B:
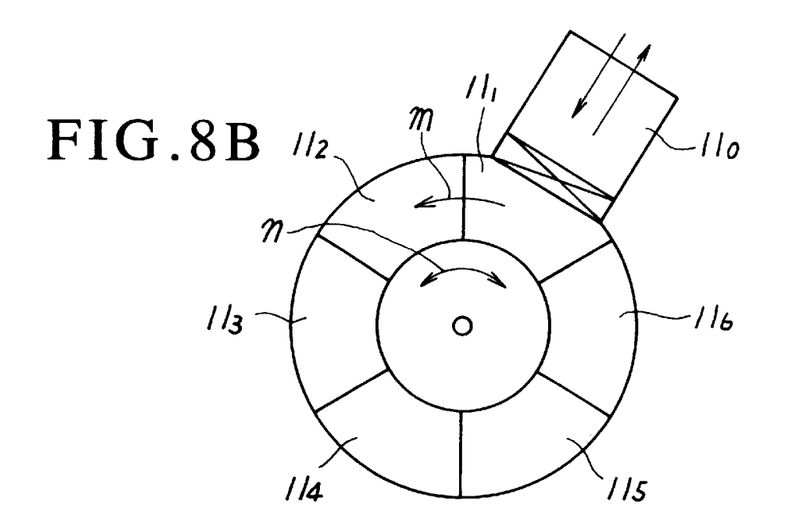
Figure 8C:
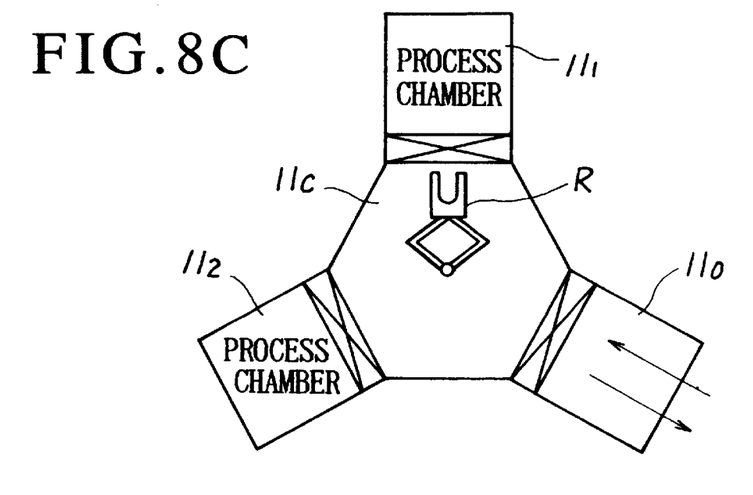

In the above embodiment, the film forming apparatus 10 is constituted by the one container 11. As described in FIG. 8, plural film forming container $11_1$, $11_2$, - - - , $11_n$ may be arranged through gate valves. In this case, the base body S is in turn moved in the one direction, to form multilayer film. A straight arrangement as shown in FIG. 8A may be used (inline type) or they may be arranged in circle as shown in FIG. 8B (rotary type). Further, a cluster type may be used. In this case, process chambers are arranged around a distribution center 11c. However, in all of the above described methods, a vacuum system, a aerosol producing chamber, a gas supply system, and a measuring control apparatus are used every film containers $11_1$, $11_2$, - - - , $11_n$. They are omitted in FIG. 8. Further, in all of the above methods, a base body introducing and taking out chamber $11_0$ is arranged for introducing the base body or taking out the base body. In the inline type as shown in FIG. 8A, an introducing chamber $11_0'$ is arranged at one end and a taking-out chamber $11_0''$ is arranged at the other end. At this case, the introducing chamber $11_0'$ may be used as the cleaning chamber of the base body S. In the rotary type as shown in FIG. 8B, the base body S is moved in the direction as shown by the arrow m. The film containers $11_1$, $11_2$, - - - , $11_6$ are rotatable in the direction as shown by the arrow n. Also, in the cluster type, they may be rotated around the distribution center 11c. A robot R which has retractable arm, is arranged in the distribution center 11c. Thus, the base body S is introduced into the process chamber and taking out there from by the robot R.

Further, in the above embodiment, aluminum is evaporated by the high frequency induction heating method. in the aerosol forming chamber 21. Another method may be used. For example an electron beam heating method, a laser heating method and arc discharging method, can be employed.

Further, in the above embodiment, the vacuum system 12 is used in common for the film forming container 11 and the aerosol formig chamber 21. Instead, a vacuum system may be arranged exclusively for the aerosol forming chamber 21. Further, in the above embodiment, the control valve 29 connected to the aerosol forming chamber 21 is used for the pressure holding and, pressure risening of the film forming container 11. However, the pressure control valve and gas bottle exclusively for the film forming container 11 may be used.

Further, the above described base body S has the through hole. It has the bottom as the upper surface of the lower layer. The through hole of larger aspect ratio may be used in the embodiment.

In the above embodiment, the aluminum thin film is formed on the base body S having the base plate 1 of silicon. However, a three-dimensional carrier of ceramics having fine holes may be applied. A catalyst such as metal, for example, palladium may be formed on the inner wall surface of the fine holes of the catalyst carrier. Further, when the surface is activated after the film forming, the film forming method and the film forming apparatus according to this invention can be applied to the carrier.

Further, in the above embodiment, the film of the ultra-fine particle of aluminum has been formed on the base body. However, another metal than aluminum, such as gold, silver, copper and platinum may be used as the material of the ultra-fine particle. Further, ceramics as ultra-fine particles, such as SiC (silicon carbide), TiN (titanium nitride). AlN (aluminum nitride), $SiO_2$ (oxygate silicon) and $Al_2O_3$ (aluminum) may be used to form thin film. Further, in this embodiment, the helium gas is exemplified as the disperse medium of the ultra-fine particle. However, instead, argon gas. hydrogen gas, nitrogen gas, oxygen gas or mixture of two or three of them may be used.

What is claimed is:

1. A method of forming a film of ultra-fine particles on a base body comprising the steps of:

(A) arranging a base body under a vacuum, said base body having a hole with a bottom or a through hole, said hole or said through hole formed therein with a diameter smaller than 2 μm and an aspect ratio of larger than one, or a groove formed therein with a width smaller than 2 μm and a ratio of depth/width larger than one;

(B) applying an aerosol onto an inner wall surface of said hole, said through hole or said groove, said aerosol including ultra-fine particles of smaller than 0.1 μm in diameter made from evaporated material with the ultra-fine particles dispersed and floating in gas under a pressure higher than $10^2$ Pa; and (C) diffusing and adsorbing said ultra-fine particles onto said inner wall surface.

2. A method of forming a film of ultra-fine particles according to claim 1, in which the thickness of said film is controlled with temperature distribution or temperature gradient applied near said hole with a bottom, said through hole or said groove in said base body.

3. A method of forming a film of ultra-fine particles according to claim 1, in which the temperature of said base body is risen to activate said ultra-fine particles and diffuse or chemically adsorb said ultra-fine particles onto said inner wall surface.

4. A method of forming a film of ultra-fine particles according to claim 1 in which the surfaces of said ultra-fine particles react with a gas of hydrogen, oxygen, nitrogen, halogen or hydrocarbon, so that said ultra-fine particles are modified.

5. A method of forming a film of ultra-fine particles according to claim 1 in which the application of said aerosol to said inner wall surface is repeated to pile films of said ultra-fine particles onto said inner wall surface.

6. A method of forming a film of ultra-fine particles according to claim 1 in which aerosols of different kinds of ultra-fine particles dispersed and floating, are applied in turn, onto said inner wall surface.

7. A method of forming a film of ultra-fine particles according to claim 1 in which an aerosol consisting of a mixture of different kinds of ultra-fine particles, dispersed and floating is applied to said inner wall surface to form a film of said mixture thereon.

8. A method of forming a film of ultra-fine particles according to claim 1 in which said film of said ultra-fine particles is covered with a protecting gas or protecting liquid to protect said film.

9. A method of forming a film of ultra-fine particles according to claim 1 in which said ultra-fine particles are metal or ceramics.

10. A method of forming a film of ultra-fine particles according to claim 1 in which said gas is one of helium, argon, hydrogen, nitrogen oxygen or a mixture of two or more of them.

* * * * *

UNITED STATES PATENT AND TRADEMARK OFFICE
CERTIFICATE OF CORRECTION

PATENT NO.   : 6,106,890
DATED        : August 22, 2000
INVENTOR(S)  : Chikara Hayashi It is certified that error appears in the above-identified patent and that said Letters Patent is hereby corrected as shown below:

Column 1,
Line 12, change "12 $\mu$ m" to -- 2 $\mu$ m --

Column 4,
Line 63, change "$\alpha - \beta$" to -- $\alpha \cdot \beta$ --

Column 6,
Line 38, change "location" to -- occasion --
Line 61, change "part g" to -- part q --

Signed and Sealed this

Eleventh Day of June, 2002

*Attest:*

JAMES E. ROGAN
*Attesting Officer*  *Director of the United States Patent and Trademark Office*